(12) United States Patent
Anderson et al.

(10) Patent No.: US 8,860,336 B2
(45) Date of Patent: Oct. 14, 2014

(54) SYSTEM AND METHOD FOR DYNAMIC SELF-SENSING OF DIELECTRIC ELASTOMER ACTUATORS

(75) Inventors: Iain Alexander Anderson, Auckland (NZ); Emilio Patricio Calius, Auckland (NZ); Todd Alan Gisby, Auckland (NZ); Benjamin Marc O'Brien, Auckland (NZ); Shane Xie, Auckland (NZ)

(73) Assignee: Auckland UniServices Limited, Auckland (NZ)

( * ) Notice: Subject to any disclaimer, the term of this patent is extended or adjusted under 35 U.S.C. 154(b) by 476 days.

(21) Appl. No.: 13/202,536

(22) PCT Filed: Feb. 18, 2010

(86) PCT No.: PCT/NZ2010/000025
§ 371 (c)(1),
(2), (4) Date: Nov. 22, 2011

(87) PCT Pub. No.: WO2010/095960
PCT Pub. Date: Aug. 26, 2010

(65) Prior Publication Data
US 2012/0086366 A1    Apr. 12, 2012

(30) Foreign Application Priority Data

Feb. 19, 2009  (NZ) ......................................... 575040

(51) Int. Cl.
*H01L 41/04* (2006.01)
*H02N 2/06* (2006.01)
(52) U.S. Cl.
CPC .............. *H01L 41/042* (2013.01); *H02N 2/062* (2013.01)
USPC .......................................... 318/116; 310/317
(58) Field of Classification Search
USPC .............................. 318/116; 310/317; 702/65
See application file for complete search history.

(56) References Cited

U.S. PATENT DOCUMENTS

| 6,809,642 B1 | 10/2004 | Brenner |
| 2010/0164324 A1 | 7/2010 | Kim |

(Continued)

FOREIGN PATENT DOCUMENTS

| JP | 2003-133189 A | 5/2003 |
| JP | 2005-522162 A | 7/2005 |

(Continued)

OTHER PUBLICATIONS

Bauer, S., and Paajanen, M., "Electromechanical Characterization and Measurement Protocol for Dielectric Elastomer Actuators," Proceedings of SPIE (Society for Optical Engineering) 6168:6168K2.1-61682K.9, Mar. 2006.

(Continued)

*Primary Examiner* — Karen Masih
(74) *Attorney, Agent, or Firm* — Christensen O'Connor Johnson Kindness PLLC

(57) ABSTRACT

A system and method is provided for determining the capacitance between electrodes of an artificial muscle or dielectric elastomer actuator (DEA). The method comprises measuring the voltage difference between the electrodes of the DEA, the first derivative of that voltage with respect to time, and the total instantaneous current through the DEA, then calculating the capacitance of the DEA as the difference between the total instantaneous current through the DEA and the product of the voltage between the electrodes and an error term, divided by the first derivative of the voltage between the electrodes with respect to time. The capacitance may then be used to derive estimates of the leakage current, charge upon the DEA, and/or the physical state of the DEA, thereby implementing self-sensing to allow closed-loop feedback control of DEA actuation.

20 Claims, 5 Drawing Sheets

(56) References Cited

U.S. PATENT DOCUMENTS

| | | | |
|---|---|---|---|
| 2012/0056509 A1* | 3/2012 | Anderson et al. | 310/317 |
| 2013/0285577 A1* | 10/2013 | O'Brien et al. | 318/116 |

FOREIGN PATENT DOCUMENTS

| | | |
|---|---|---|
| JP | 2006-109632 A | 4/2006 |
| JP | 2008-216074 A | 9/2008 |
| KR | 10-2009-0095291 A | 9/2009 |
| WO | 03/081762 A1 | 10/2003 |

OTHER PUBLICATIONS

Gisby, T.A., et al., "An Adaptive Control Method for Dielectric Elastomer Devices," Proceedings of SPIE (Society for Optical Engineering) 6927:69271C.1-69271C.8, Mar. 2008.

Jung, K., et al., "A Self-Sensing Dielectric Elastomer Actuator," Sensors and Actuators A: Physical 143(2):343-351, May 2008.

Keplinger, C., et al., "Capacitive Extensometry for Transient Strain Analysis of Dielectric Elastomer Actuators," Applied Physics Letters 92(19):192903.1-192903.3, May 2008.

Kofod, G., "Dielectric Elastomer Actuators," doctoral dissertation, Technical University of Denmark, Lyngby, Denmark, Sep. 2001, 125 pages.

O'Brien, B., et al., "Integrated Extension Sensor Based on Resistance and Voltage Measurement for a Dielectric Elastomer," Proceedings of SPIE (Society for Optical Engineering) 6524:652415.1-652415.11, Mar. 2007.

Toth, L.A., and A.A. Goldenberg, "Control System Design for a Dielectric Elastomer Actuator: The Sensory Subsystem," Proceedings of SPIE (Society for Optical Engineering) 4695:323-334, Mar. 2002.

International Search Report mailed Aug. 26, 2010, issued in corresponding International Application No. PCT/NZ2010/000025, filed Feb. 18, 2010, 4 pages.

International Preliminary Report on Patentability mailed Aug. 23, 2011, in corresponding International Application No. PCT/NZ2010/000025, filed Feb. 18, 2010, 7 pages.

Office Action mailed Feb. 4, 2014, issued in corresponding Japanese Application No. 2011-551029, filed Feb. 18, 2010, 8 pages.

\* cited by examiner

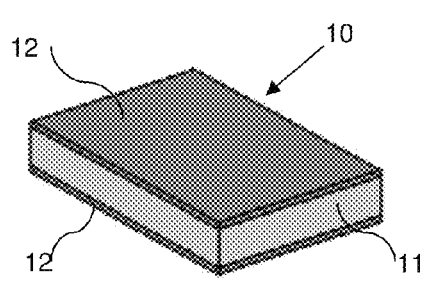
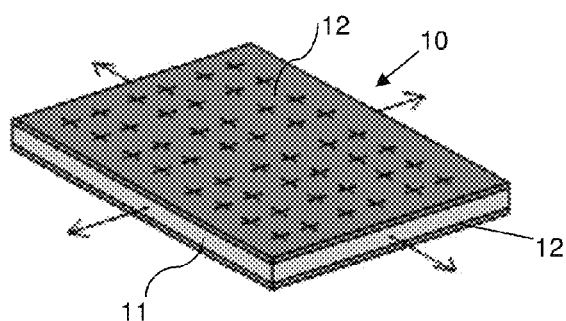
Figure 1(a)　　　　　　　　Figure 1(b)
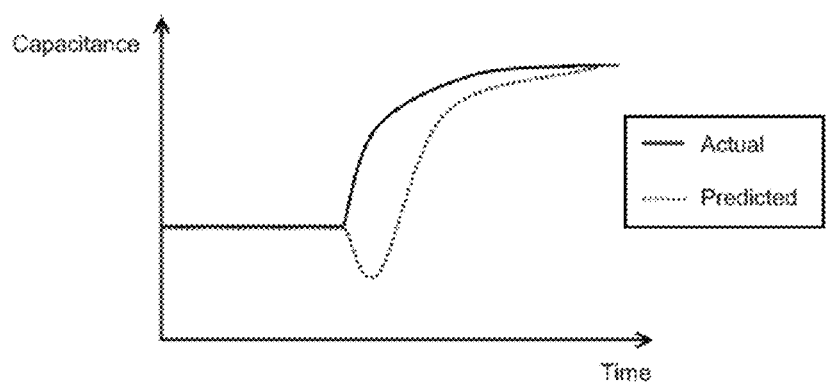
Figure 2
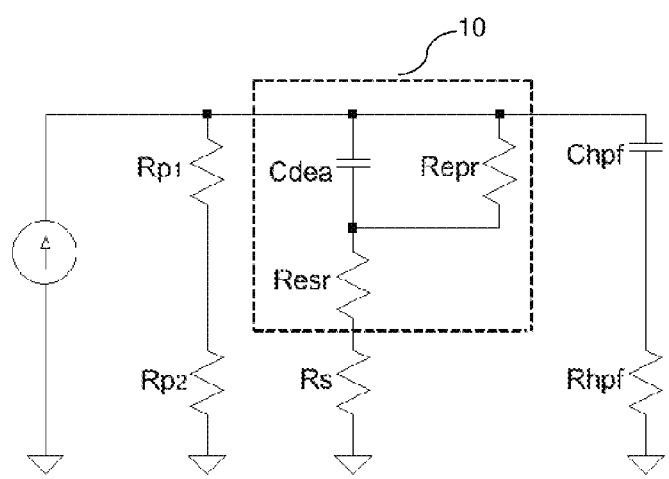
Figure 3

SYSTEM AND METHOD FOR DYNAMIC SELF-SENSING OF DIELECTRIC ELASTOMER ACTUATORS

FIELD

This invention relates to the field of dielectric elastomer actuators. More particularly, the invention provides a system and method for obtaining feedback from a dielectric elastomer actuator (DEA) by way of self-sensing.

BACKGROUND

Artificial muscles seek to replicate or mimic the versatility and capability of natural skeletal muscles in exerting a mechanical force, but using electrical energy. Accordingly, an artificial muscle forms a useful electrical-mechanical transducer or actuator, exerting a mechanical force through contraction and/or expansion.

Skeletal muscle is an amazingly versatile linear actuator. Traditional actuation technologies such as piezoelectrics, electromagnetics, and shape memory alloys may be capable of out-performing skeletal muscle in specific areas (e.g. speed, pressure, or energy density) but none are capable of operating effectively in as wide a range of conditions as muscle. By being highly compliant when not activated and only recruiting individual muscle units as they are required, skeletal muscle has great scope for optimizing efficiency for a wide range of loads and speeds.

Mimicking the well-rounded performance and characteristics of skeletal muscle with an artificial actuator has not been possible with traditional technologies. Electromagnetic motors for instance are heavy and rigid, and often must be coupled with a gearbox in order to achieve a useful output, with each additional component or moving part adding its own inherent losses and complexity to the system. Piezoelectrics are capable of high active speeds and pressures, but unlike muscle, they are extremely brittle and have very small output strains. Shape memory alloys can produce high pressures and moderate strains, but are slow and susceptible to fatigue loading. Dielectric Elastomer Actuators (DEAs), however, present a very promising alternative to these traditional technologies. DEA performance in terms of strain, speed, and energy density compare very favourably with those of skeletal muscle, and importantly their low material density, compliant nature, and silent operation capture many of the desirable physical properties of muscle.

Referring to FIGS. 1(a) and 1(b), a DEA generally referenced 10 comprises a dielectric elastomer membrane 11 provided between compliant electrodes 12. The dielectric elastomer membrane 11 is compressed by electrostatic pressure when a high voltage is applied across the electrodes 12 in the manner of a capacitor, causing planar expansion of the polymer from the uncompressed or contracted state as shown in FIG. 1(a), to the compressed or expanded state illustrated in FIG. 1(b).

Natural muscle, however, is much more than just an actuator, as it provides position feedback to the brain. Specialized cells within muscle tissue provide feedback to the body's central nervous system and this information is crucial to the coordination of muscle groups necessary for maintaining balance and posture. In an extreme case, that feedback may include a pain signal when there is a danger of overexertion causing damage to the muscle or other parts of the body. Automatic reflex actions in response to this feedback can even occur without conscious thought, particularly in an attempt to prevent harm e.g. recoiling from a sharp object. Skeletal muscle is a key component in the distributed control system that is the human body.

Because a DEA is constructed from a material which is resistant to compression, it is possible to relate a change in capacitance to changes in the physical geometry of the DEA. "An adaptive control method for dielectric elastomer devices" (Todd A. Gisby, Emilio P. Calius, Shane Xie, and Iain A. Anderson, Proc. SPIE, 2008), the contents of which are incorporated herein by way of reference, discloses the use of self-sensing based upon the capacitance between electrodes to determine the state of a DEA, thereby providing some feedback. Similar methods are disclosed by "Control system design for a dielectric elastomer actuator: The sensory subsystem" (Toth, L. A. and A. A. Goldenberg, Proceedings of SPIE, 2002) and "A self-sensing dielectric elastomer actuator" (Jung, K., K. J. Kim, and H. R. Choi, Sensors and Actuators A: Physical, 2008).

However, existing self-sensing methods are accurate only under certain circumstances, such as when the DEA is stationary (i.e. not subject to any perturbations caused by external forces), the leakage current is negligible, and/or for low actuation speeds, or are based upon assumptions which may not always hold true. In addition, the methods of the prior art may not be suitable for practical implementation in a system designed for portable use. Accordingly, there is currently no satisfactory method for accurately determining the capacitance or state of a dielectric elastomer actuator, or providing feedback of movement of an artificial muscle using self-sensing.

OBJECT OF THE INVENTION

It is therefore an object of the invention to provide improved feedback on the state of an artificial muscle, or at least to provide the public with a useful choice.

Further objects of the invention will become apparent from the following description.

SUMMARY OF INVENTION

According to a first aspect the invention may broadly be said to consist in a method of determining the capacitance between opposing electrodes of a dielectric elastomer actuator (DEA), the method comprising the steps of:
 measuring the voltage difference between the electrodes of the DEA;
 determining the first derivative of the voltage difference between the electrodes of the DEA with respect to time;
 measuring the total instantaneous current through the DEA; and
 calculating the capacitance of the DEA as the difference between the total instantaneous current through the DEA and the product of the voltage between the electrodes of the DEA and an error term, divided by the first derivative of the voltage between the electrodes of the actuator with respect to time.

Preferably the error term is equal to the total instantaneous current through the DEA divided by the voltage difference between the electrodes of the DEA when the first derivative of the voltage difference between the electrodes of the DEA with respect to time is equal to zero.

Preferably the DEA is supplied by a pulse-width modulated (PWM) current source having a limited slew rate on either or both edges.

Preferably the slew rate of the current source is selected to enable accurate detection of the zero-crossing of the first derivative of the voltage difference between the electrodes of the DEA with respect to time, thereby minimising sensitivity to errors in the sample timing when sampling the total instantaneous current through the DEA.

Preferably the step of measuring the voltage difference between the electrodes of the DEA comprises approximating the voltage using a resistor ladder.

Preferably the step of determining the first derivative of the voltage difference between the electrodes of the DEA with respect to time comprises approximating the first derivative using a differentiator circuit.

Alternatively, the step of determining the first derivative of the voltage difference between the electrodes of the DEA with respect to time comprises approximating the first derivative using a finite difference method on sequential measurements of the voltage difference between the electrodes of the DEA.

Preferably the step of measuring the total instantaneous current through the DEA comprises the step of measuring the voltage difference across a known series resistance.

According to a second aspect the invention may broadly be said to consist in a method of determining the leakage current between opposing electrodes of a dielectric elastomer actuator (DEA), the method comprising the steps of:
  determining the capacitance between the electrodes according to the method of the first aspect of the invention;
  calculating the first derivative of the capacitance with respect to time; and
  calculating the leakage current as the difference between the total instantaneous current through the DEA and the product of the voltage difference across the DEA and the first derivative of the capacitance with respect to time, at a point in time when the first derivative of the voltage difference across the DEA with respect to time is substantially equal to zero.

According to a third aspect the invention may broadly be said to consist in a method of determining the state of a dielectric elastomer actuator (DEA), the method comprising the steps of:
  determining the capacitance between opposing electrodes of the actuator according to the method of the first aspect of the invention; and
  determining the state of the DEA corresponding with the capacitance.

Preferably the step of determining the state of the DEA comprises the steps of:
  a) determining the ratio of the instantaneous capacitance of the DEA to its initial capacitance;
  b) relating the ratio of step a) to the ratio between the instantaneous planar area of the DEA to its initial planar area; and
  c) determining the displacement of the DEA from the relationship determined in step b).

According to a fourth aspect the invention may broadly be said to consist in a method of controlling a dielectric elastomer actuator (DEA) comprising the steps of:
  determining the state of the DEA according to the method of the third aspect of the invention; and
  controlling the charge on the electrodes of the DEA according to the difference between the determined state and a desired state of the DEA.

Preferably the method further comprises the steps of:
  determining the leakage current according to the second aspect of the invention; and
  limiting the charge upon the electrodes when the leakage current exceeds a predefined threshold.

According to a fifth aspect the invention may broadly be said to consist in a system for determining the capacitance between opposing electrodes of a dielectric elastomer actuator (DEA), the system comprising:
  a DEA monitoring circuit to obtain feedback information regarding the electrical behaviour of DEA; and
  computation means adapted to calculate the capacitance of the DEA as the difference between the total instantaneous current through the DEA and the product of the voltage difference across the DEA and an error term, divided by the first derivative of the voltage difference across the actuator with respect to time.

Preferably the DEA monitoring circuit comprises:
  a pulse-width modulated current source;
  a dielectric elastomer actuator (DEA);
  means for measuring the voltage difference across the DEA;
  means for measuring the first derivative of the voltage difference across the DEA with respect to time; and
  means for measuring the total instantaneous current through the DEA.

Preferably the means for measuring the voltage difference comprises a resistor ladder, the means for measuring the first derivative of the voltage difference comprises a differentiator circuit, and the means for measuring the current through the DEA comprises a series resistor.

Preferably the error term is equal to the total instantaneous current through the DEA divided by the voltage difference across the DEA when the first derivative of the voltage difference across the DEA with respect to time is equal to zero.

Preferably the computation means is further adapted to determine the state of the DEA corresponding with the calculated capacitance.

Preferably the computation means is further adapted to control the state of the DEA by way of controlling the current source.

According to a sixth aspect the invention may broadly be said to consist in a method of modelling or simulating a dielectric elastomer actuator (DEA), the method comprising the step of representing the DEA as an ideal capacitance augmented with an equivalent parallel resistance to account for leakage current, and an equivalent series resistance to account for the resistance of the electrodes.

In a further aspect the invention may broadly be said to consist in a method of determining the state of a DEA, the method comprising the steps of:
  a) determining the ratio between the total instantaneous current through the DEA and the voltage difference across the DEA at a time when the change in voltage difference across the DEA is zero or close to zero;
  b) multiplying the ratio of step a) with the voltage difference across the DEA when the change in voltage is non-zero;
  c) subtracting the product of step b) from the total instantaneous current through the DEA;
  d) dividing the sum of step c) by the instantaneous change in voltage difference across the DEA with respect to time; and
  e) using the product of step d) to determine the state of the DEA.

Further aspects of the invention, which should be considered in all its novel aspects, will become apparent from the following description.

DRAWING DESCRIPTION

A number of embodiments of the invention will now be described by way of example with reference to the drawings in which:

FIG. 1 shows a dielectric elastomer actuator (DEA) according to the prior art, in (a) uncompressed, and (b) compressed states;

FIG. 2 shows a graph of the error between the predicted and actual values of capacitance during transient states of the actuator using a quasi-static method of determining capacitance according to the prior art;

FIG. 3 is a schematic of an example DEA monitoring circuit according to the present invention;

DETAILED DESCRIPTION OF THE DRAWINGS

Figure 4:
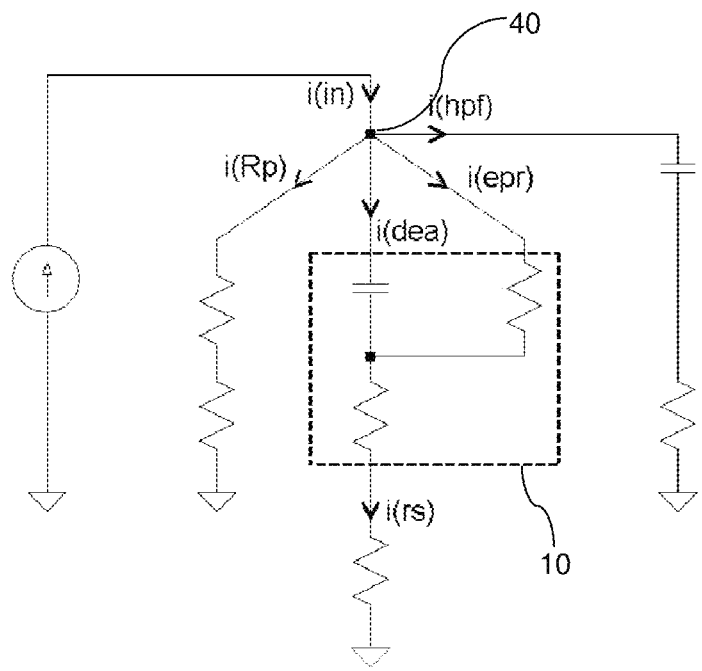
FIG. 4 illustrates the application of Kirchoff's current law to the circuit of FIG. 3.

Throughout the description like reference numerals will be used to refer to like features in different embodiments.

Structurally, dielectric elastomer actuators (DEAs) resemble a compliant capacitor consisting of a resilient soft polymer membrane dielectric 11 with compliant electrodes 12 on substantially opposing sides of the membrane. The charge accumulated on the electrodes 12 after a voltage is applied gives rise to electrostatic forces that generate deformation in the DEA 10. The net result of the interaction between the positive and negative charges and the mechanical properties of the DEA produces a coupled decrease in dielectric membrane 11 thickness and increase in membrane planar area, as shown in FIG. 1(*b*). When the charge is removed, the elastic energy stored in the dielectric returns it to its original shape as shown in FIG. 1(*a*).

The charge-generated surface pressure, or Maxwell stress, is proportional to the square of the electric field within the dielectric and can be described by Equation 1. P is the pressure, $\varepsilon_r$ is the relative permittivity of the dielectric material, $\varepsilon_0$ is the permittivity of free space (8.854×10$^{-12}$ F/m), V is the voltage, and d is the dielectric membrane thickness in meters.

$$P = \varepsilon_r \varepsilon_0 \left(\frac{V}{d}\right)^2 \quad (1)$$

The present invention seeks to provide similar feedback functionality as that of natural muscle by integrating a sensing ability. Accordingly, a feedback system according to the present invention provides feedback on the state of a dielectric elastomer actuator (DEA) 10, giving an indication of the extent to which the membrane 11 is compressed, and/or the corresponding planar expansion thereof.

Sensing and feedback in actuators according to the prior art have typically required the incorporation of sensors such as optical sensors, strain gauges, micro-switches and the like which are external to the components of the actuator itself, creating an actuator/sensor hybrid. While the benefit of feedback allows improved control of the actuator, the sensors increase the component count and complexity of the actuator. An important property of DEAs is the potential for self-sensing, i.e. sensing an electrical property of the actuator itself. In particular, the state of a DEA can be determined by sensing the capacitance between the electrodes 12.

A self-sensing artificial muscle has the potential to be more compact and simpler to construct than actuators incorporating external sensors owing to reduced component count, and may also provide a built-in safety mechanism whereby the health of the DEA can be monitored, as will be described in further detail below. However, due to the high voltages applied to the electrodes which are necessary to actuate a DEA, implementing capacitive self-sensing is not as simple as applying the capacitive sensing techniques commonly applied in other fields.

DEAs represent a highly coupled electro-mechanical system. Where they are coupled to a "real world" load susceptible to non-deterministic disturbances, controlling them with any degree of accuracy becomes an interesting challenge. There is a complex exchange of electrical and mechanical energy; a high voltage input must be applied to achieve mechanical actuation, yet the mechanical response of the DEA (whether due to the electrical input energy or an external disturbance) affects the necessary input to achieve the desired output state. Feedback is necessary to achieve accurate control.

Self-sensing can be implemented by measuring the capacitance of the DEA. Owing to the resilience or tendency of the dielectric membrane 11 to return to its original uncompressed state, it is possible to relate the capacitance of a DEA 10 to its state of deformation. Measuring the capacitance of a DEA 10 is important because with the instantaneous capacitance and voltage, the instantaneous electrostatic charge on the DEA can be calculated and therefore controlled. Controlling charge results in a stable system where the electrostatic response of the DEA will act to reject external physical disturbances. For instance if the DEA deforms such that the thickness is reduced, the capacitance will increase. If a constant charge is maintained, the voltage difference across the DEA must drop and the electric field will therefore decrease, reducing the effective electrostatic pressure. The elastic energy in the dielectric membrane 11 will also increase, and both of these effects will create a net effect counteracting the influence of the disturbance. In contrast, if the charge did not remain constant i.e. if the voltage was held constant, an increase in the capacitance of the DEA will mean more charge would flow onto the DEA 10. This extra charge will serve to increase the electric field and subsequently the electrostatic pressure. If the electric field is allowed to grow too large the DEA will undergo dielectric breakdown. When this happens the charge on the DEA will be rapidly discharged through the thickness of the membrane 11, generating significant heat and often resulting in catastrophic failure of the DEA 10. However, while it may for this reason generally be preferable to maintain a constant charge on the DEA electrodes, the charge may alternatively be allowed to vary without departing from the scope of the present invention.

Prior examples of self-sensing include the systems presented by Toth and Goldenberg, and Jung et al., as referenced above. Both have created systems whereby the capacitance, and hence displacement, can be measured while the DEA is being actuated. In these integrated sensor/actuator systems the DEA is treated as the capacitive component of an RC filter, with the dynamic response of the DEA circuit to a low amplitude, high frequency sensory signal overlaid on the high amplitude, low frequency actuation voltage used to calculate capacitance.

According to the present invention, a slew-rate controlled PWM signal is preferably used to create an input current waveform that creates both a DC offset for actuation and a dynamic high frequency excitation used for measuring capacitance. This approach builds upon the self-sensing technique for quasi-static DEA systems disclosed by Gisby et al. (Todd A. Gisby, Emilio P. Calius, Shane Xie, and Iain A. Anderson, "An adaptive control method for dielectric elastomer devices", Proc. SPIE, 2008), the contents of which are incorporated herein by reference. More specifically, the preferred capacitive self-sensing technique takes into account the effects of leakage current and a non-zero first derivative of the DEA capacitance with respect to time, both of which were ignored in the self-sensing techniques of the prior art. Ignoring these effects results in a significant error in the predicted value of the capacitance during transient states of the actuator, as shown in FIG. 2. Accordingly, an electrical representation of a "real" DEA has been developed to determine how to approximate the influence of electrical behaviours within the DEA (that cannot be measured directly) using electrical parameters that can be measured.

For reasons outlined above a system using the instantaneous charge on the DEA as the primary control variable is preferred. However, charge cannot be measured directly therefore DEA capacitance and voltage must be known in order to calculate charge according to Equation 2.

$$Q = CV \qquad (2)$$

Voltage can easily be measured using a resistance ladder network, for example, but in order to calculate capacitance it is necessary to look at the derivative of Equation 2, which for an ideal capacitor is given in Equation (3).

$$i = C\frac{dV}{dt} + \frac{dC}{dt}V \qquad (3)$$

A DEA, however, is not an ideal capacitor. In reality the DEA is represented by an ideal capacitance ($C_{dea}$) augmented with an equivalent parallel resistance ($R_{epr}$) in parallel to account for leakage current and an equivalent series resistance ($R_{esr}$) to account for the resistance of the electrodes. The nature of the DEA means that it is impossible to separate the current flowing through the capacitive element of the DEA and the leakage current without assuming the DEA is behaving in some predetermined manner. It is necessary therefore to find some way of relating the effects of these currents to electrical characteristics that can be measured. The example DEA monitoring circuit illustrated in FIG. 3 has been designed to obtain feedback information regarding the electrical behaviour of the circuit, wherein the DEA 10 is represented by the capacitor $C_{dea}$ (representing the capacitance between the electrodes 12) and resistors $R_{esr}$ and $R_{epr}$ within the dotted-line box. $C_{dea}$, $R_{epr}$, and $R_{esr}$ will vary depending on the electromechanical loading of the DEA. $R_{p1}$ and $R_{p2}$ represent a voltage divider ladder used to directly measure the voltage difference across the DEA. $C_{hpf}$ and $R_{hpf}$ represent a simple high pass filter that acts as a differentiator circuit and can be used to measure the rate of change of voltage across the DEA. The circuit has been designed to be driven by a low power, high voltage DC-DC converter coupled with a high voltage opto-coupler (such as the OC100HG, available from Voltage Multipliers, Inc.) or other suitable switch. The properties of these components combined can effectively be modelled as a current source.

Kirchoff's Current Law states the sum of all currents entering and exiting a junction in a circuit must be zero. Using this relationship the current through resistor $R_s$ ($i_{Rs}$, effectively the total instantaneous current through the actuator) can be defined by Equation 4, where $i_{dea}$ and $i_{epr}$ are the currents through $C_{dea}$ and $R_{epr}$ respectively.

$$i_{Rs} = i_{dea} + i_{epr} \qquad (4)$$

Equation 4 can be expanded to incorporate the full expression for $i_{dea}$ (from Equation 3) and $i_{epr}$, to become Equation 5, where $V_{dea}$ is the voltage across the capacitor $C_{dea}$.

$$i_{Rs} = C_{dea}\frac{dV_{dea}}{dt} + \frac{dC_{dea}}{dt}V_{dea} + \frac{V_{dea}}{R_{epr}} \qquad (5)$$

Equation 5 states that the overall current through the DEA is a function of the capacitance and the voltage, the first derivatives of both of these parameters, and the leakage current. If leakage current through the DEA and $dC_{dea}/dt$ are sufficiently small (i.e. if the actuator is moving slowly/stationary) the second and third terms of Equation 5 can be ignored and calculating capacitance becomes straightforward using Equation 6 as described by Gisby et al.

$$C_{dea} = \frac{i_{Rs}}{\left(\frac{dV_{dea}}{dt}\right)} \qquad (6)$$

Figure 6:
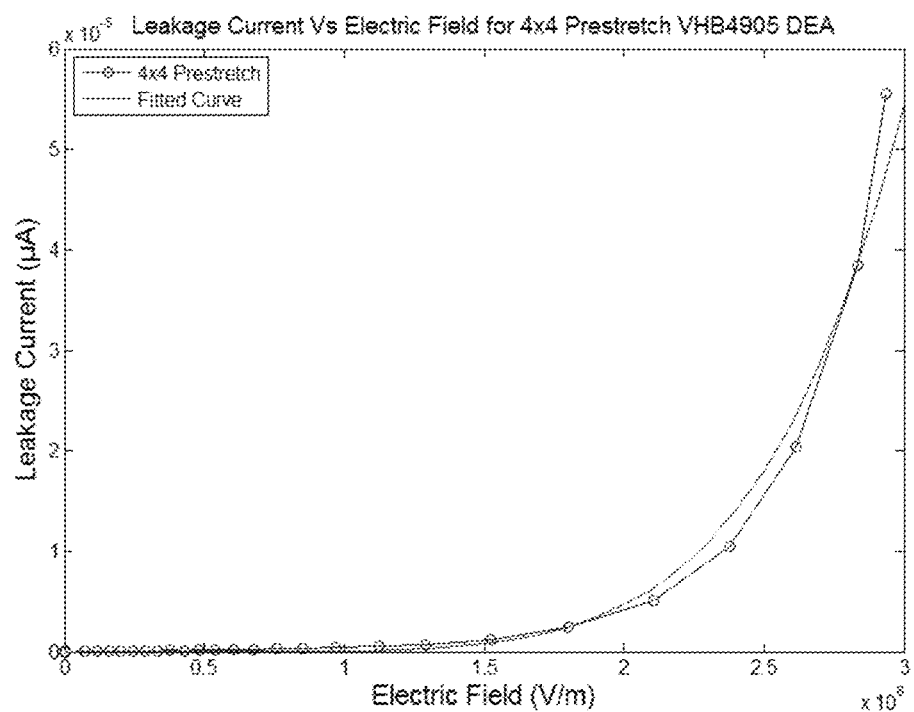
FIG. 6 shows the leakage current versus electric field for an example DEA.

The limitation of this approach is that ignoring the latter two terms of Equation 5 introduces an error that is proportional to the sum of the speed of actuation and the leakage current. Leakage current, for the common DEA membrane material VHB4905 at least, begins to degrade the accuracy of the calculation for electric fields greater than approximately 80-100 MV/m as shown in FIG. 6. A more advanced approach is necessary to calculate capacitance where these simplifying assumptions do not hold.

Examining Equation 5 it is clear five parameters must be known in order to calculate $C_{dea}$: $i_{Rs}$, $dV_{dea}/dt$, $dC_{dea}/dt$, $V_{dea}$, and $R_{epr}$. $V_{dea}$ and $dV_{dea}/dt$ can be approximated using the resistor ladder and differentiator circuit respectively, and $i_{Rs}$ can be measured directly. Measuring $i_{epr}$ and $dC_{dea}/dt$ for all conditions however is impossible due to the closed loop formed by $C_{dea}$ and $R_{epr}$ internal to the DEA. For this reason it is necessary to lump the contribution of $i_{epr}$ and $dC_{dea}/dt$ to the calculation of $C_{dea}$ into a combined term. Further simplification however is still required if $C_{dea}$ is to be calculated. This can be done by measuring $i_{Rs}$ when $dV_{dea}/dt$ is equal to zero, thereby eliminating the first term on the right hand side of Equation 5 to arrive at Equation 7.

$$i_{Rs} = V_{dea}\left(\frac{dC_{dea}}{dt} + \frac{1}{R_{epr}}\right) \qquad (7)$$

The influence of $dC_{dea}/dt$ and $R_{epr}$ are then combined into $K_{error}$ as given by Equation 8.

$$K_{error} = \frac{i_{Rs}}{V_{dea}} \quad (8)$$

Now, while their relative sizes of $dC_{dea}/dt$ and $R_{epr}$ are unknown, their combined effect is. By assuming $dC_{dea}/dt$ and $R_{epr}$ remain constant around the point where $dV_{dea}/dt$ is zero and substituting Equation 8 back into Equation 5 and evaluating it for any point where $dV_{dea}/dt$ is non-zero, the final capacitance can be calculated using Equation 9.

$$C_{dea} = \frac{(i_{Rs} - V_{dea}K_{erorr})}{\left(\frac{dV_{dea}}{dt}\right)} \quad (9)$$

Broadly speaking, therefore, the method involves calculating an electrical characteristic (capacitance) of the circuit from other characteristics ($i_{Rs}$, $dV_{dea}/dt$, $dC_{dea}/dt$, $V_{dea}$, and $R_{epr}$) which can be measured directly.

Once the DEA capacitance $C_{dea}$ is determined, this value can be used to estimate or determine the position or state of the actuator corresponding therewith. By relating the instantaneous capacitance of the DEA to its initial capacitance (i.e. the capacitance between the electrodes when the DEA is at rest or equilibrium), the ratio ($\lambda_A$) of the instantaneous planar area of the DEA to its initial planar area, and therefore the displacement of the DEA, can be determined using the relationship of Equation 10.

$$\lambda_A = \sqrt{\frac{C_{dea}}{C_{initial}}} \quad (10)$$

Accordingly, the method provides more accurate feedback for the control of artificial muscles, whereby a computation means calculating the capacitance may be further adapted to control the artificial muscle by way of controlling the pulse width or duty cycle of a current source supplying the DEA such that the actual (determined) position or state of the actuator substantially matches a required state, thereby forming a closed feedback loop for more precise control of a mechanical system with which the artificial muscle may be coupled.

Each time $dV_{dea}/dt$ is equal to zero it is therefore possible to calculate $C_{dea}$. If the existing and previous estimations of capacitance are known ($C_{dea}$ and $C_{dea(previous)}$ respectively), and the time between these estimations (t) is also known, a backwards difference approximation can be used to estimate $dC_{dea}/dt$. Equation 5 can then be rearranged and used to back calculate the leakage current ($i_{epr}$) according to Equation 11.

$$\frac{V_{dea}}{R_{epr}} = i_{epr} = i_{Rs} - C_{dea}\frac{dV_{dea}}{dt} - \frac{(C_{dea} - C_{dea(previous)})}{t}V_{dea} \quad (11)$$

Monitoring the leakage current can enable detection of the precursors to dielectric breakdown and failure of the DEA. It can therefore be used to stop overcharging of the membrane which leads to breakdown. For example, the charge on the DEA may be limited when the leakage current exceeds a predefined threshold. Detecting and preventing breakdown not only increases device reliability, but also enables the DEA to be driven closer to its performance limits with greater confidence.

A numerical model of the circuit presented in FIG. 3 can be created in The MathWorks, Inc.'s MATLAB®, for example, to test the effectiveness of the new self-sensing approach compared with the simplified quasi-static expression described by Equation 6. The model simulates behaviour of the DEA system for conditions where the input control signal is held constant while the capacitance changes i.e. a situation analogous to the DEA being deformed by an external load. To do this the model takes arbitrary functions for input current, DEA capacitance, and DEA leakage current as inputs, and incrementally solves for the current through each branch of the circuit at each time step. The initial electrical characteristics of the components comprising the DEA have been modelled on experimental data obtained from a simple 24 mm diameter expanding dot actuator made from a VHB4905 membrane stretched equibiaxially to 16 times its original area and bonded to a rigid circular plastic frame. This actuator has an initial dielectric membrane thickness of 31.25 μm and a rest capacitance of approximately 500 pF.

FIG. 4 shows the schematic for the DEA 10 electrical subsystem that is the basis of the numerical model. Again using Kirchoff's Current Law, the current entering/exiting the upper junction 40 in FIG. 4 is expressed by Equation 12, where $i_{in}$ is the user defined input current, $i_{Rp}$ is the current through the resistor ladder used to measure the voltage across the DEA, $i_{dea}$ is the charging/discharging current flowing through the DEA, $i_{epr}$ is the leakage current through the thickness of the membrane, and $i_{hpf}$ is the current through the high pass filter.

$$i_{in} = i_{Rp} + i_{dea} + i_{epr} + i_{hpf} \quad (12)$$

The instantaneous current through the DEA ($i_{dea}$) is evaluated for every time step and integrated to calculate the charge stored on the DEA. After each iteration of the model, the instantaneous DEA capacitance at the next time step is interpolated from the capacitance input function, and the voltage across the DEA for the next iteration is found by dividing the new charge by the new capacitance.

The current $i_{Rp}$ is easily evaluated as the sum of the DEA voltage and the voltage across the known series resistance divided by the total resistance of the external resistor ladder. The leakage current through the membrane ($i_{epr}$) is modelled as an electric field dependent parameter. A relationship between electric field and leakage current was found by fitting an exponential curve to electric field versus leakage current data obtained experimental using the VHB4905 test actuator. The mathematical representation of this curve was then used to calculate the instantaneous $i_{epr}$ for each time step in the model simulation. The function for the leakage current can be defined completely arbitrarily, it is simply to add a degree of realism that it is based upon experimental data for a real DEA. Both the quasi-static and dynamic methods for calculating capacitance rely solely on parameters that can be measured directly i.e. $i_{Rp}$, $i_{Rs}$, and $i_{hpf}$.

Before $i_{epr}$ can be calculated it is necessary to calculate the electric field in the DEA. This requires knowledge of the voltage across the DEA and the instantaneous membrane thickness. The voltage can be easily calculated based on previous iterations of the model, and, assuming uniform deformation of the DEA, the instantaneous membrane thickness can be calculated based on a function of the ratio of the initial membrane thickness initial capacitance and the instantaneous capacitance as given by Equation 13.

$$d = \left(\sqrt{\frac{C_{dea(rest)}}{C_{dea}}}\right)d_{rest} \quad (13)$$

With $i_{in}$, $i_{Rp}$, and $i_{epr}$ now calculated, the remaining current not accounted for is shared between $i_{hpf}$ and $i_{dea}$. The fixed capacitance of the passive high pass filter means $i_{hpf}$ is solely proportional to the rate of change of the voltage across the capacitor. The shared positive electrode between the capacitive element of the DEA and the high pass filter means the rate of change of the voltage across both can be approximated as being the same (Equation 14).

$$\frac{dV_{dea}}{dt} = \frac{i_{hpf}}{C_{hpf}} \quad (14)$$

Substituting Equation 14 into Equation 5 gives Equation 15.

$$i_{Rs} = C_{dea}\frac{i_{hpf}}{C_{hpf}} + \frac{dC_{dea}}{dt}V_{dea} + \frac{V_{dea}}{R_{epr}} \quad (15)$$

Substituting Equation 15 into Equation 12 gives Equation 16.

$$i_{hpf} = \frac{\left(i_{in} - i_{Rp} - i_{epr} - \frac{dC_{dea}}{dt}V_{dea}\right)}{\left(1 + \frac{C_{dea}}{C_{hpf}}\right)} \quad (16)$$

Once $i_{hpf}$ is known, $i_{dea}$ can be evaluated algebraically using Equation 12.

It is necessary to measure $i_{rs}$ at the point where $dV_{dea}/dt$ is equal to zero in order to calculate $K_{error}$. For a periodic input signal, this occurs during the periods where the input current is either ramping up or ramping down. For simplicity the model employed here focuses on the period for which the input current is ramping down, however it could equally be applied to when the input current is ramping up or indeed both ramping up and down.

Figure 5:
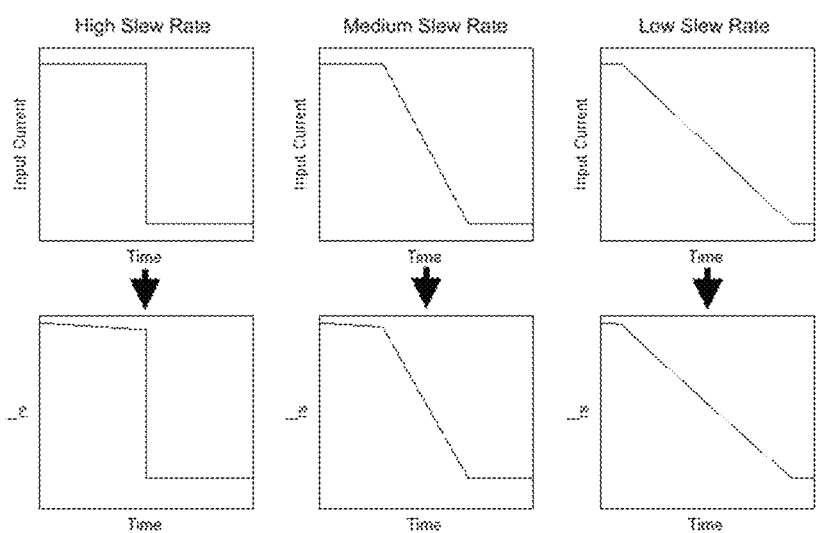
FIG. 5 shows the effect the slew rate of the current source has on the rate of change of $i_{Rs}$.

If the input current is controlled using a pure PWM signal it will inherently have a very high slew rate, which means capturing data at the zero-crossing or the exact point where $dV_{dea}/dt$ equals zero requires prohibitively fast data acquisition capabilities. By introducing a limited slew rate to the input signal, the transition of $dV_{dea}/dt$ progressing from being positive to being negative is spread over a longer time period. This reduces the sensitivity of sampling $i_{rs}$ to errors in the sample timing. FIG. 5 shows quantitatively the effect slew rate has on the rate of change of $i_{rs}$ (note the slew rate has only been applied to the falling edge of the input signal). For the numerical model, the input current was limited to a maximum of 100 uA, and a maximum slew rate of 200 mA/s was imposed on the falling edge of the input current waveform. A suitable slew rate is dependent on the actuator and the system.

Leakage current data versus electric field for a VHB4905 expanding dot actuator stretched equibiaxially to 16 times its original area is presented in FIG. 6. Also shown in FIG. 6 is an exponential curve that has been fitted to the raw data to provide a mathematical relationship between electric field and leakage current for use in the numerical model. The fitted curve used in the model has the parameters of Equation 17.

$$i_{epr} = 2.458 \times 10^{-6}\left(\frac{E_{field}}{180 \times 10^6}\right)^{6.0625} \quad (17)$$

An arbitrary input capacitance waveform was created with features corresponding to 5 conditions: a constant capacitance; a slow increase in capacitance; a fast increase in capacitance; a fast decrease in capacitance; and a slow decrease in capacitance. The input current waveform was fixed as a 500 Hz PWM signal with a maximum value of 100 uA and a limiting slew-rate of rate of 200 mA/s was applied to the falling edge of the PWM signal. Leakage current was calculated based on the instantaneous electric field according to the relationship described in Equation 17. The simulation used a step size of 2 μs.

Figure 7:
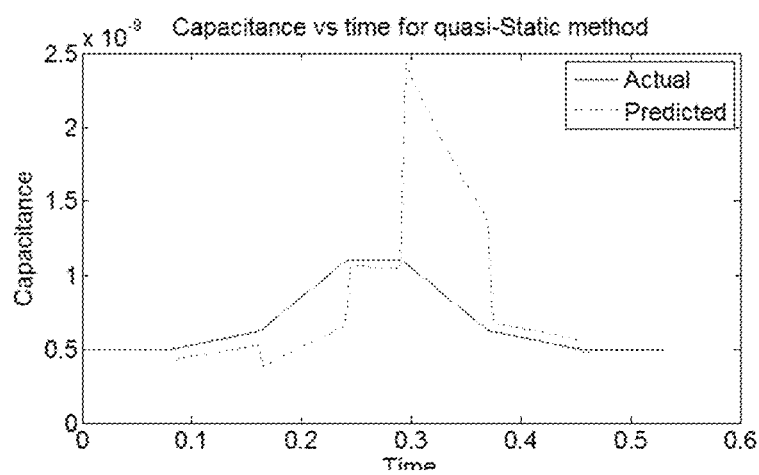
FIG. 7 is a graph of actual and predicted capacitance versus time for the quasi-static method of the prior art.
Figure 8:
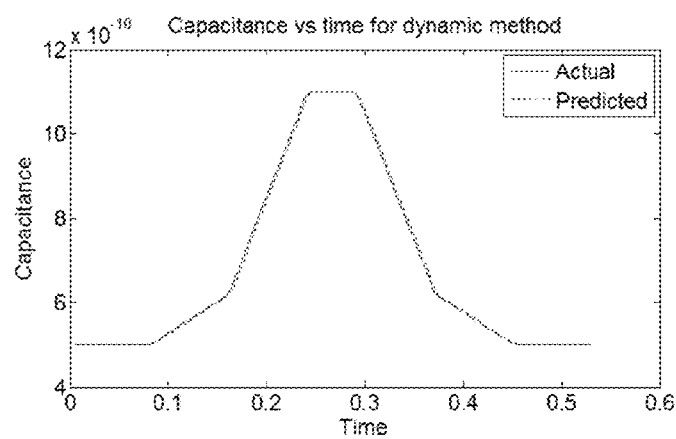
FIG. 8 is a graph of actual and predicted capacitance versus time for the dynamic method of the present invention.
Figure 9:
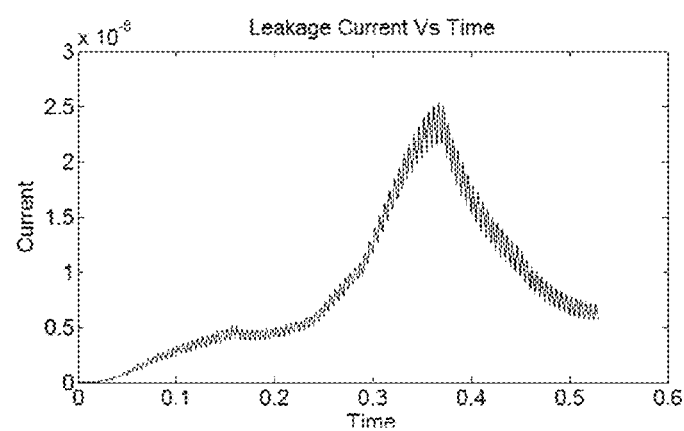
FIG. 9 shows the leakage current versus time over the course of the simulation.
Figure 10:
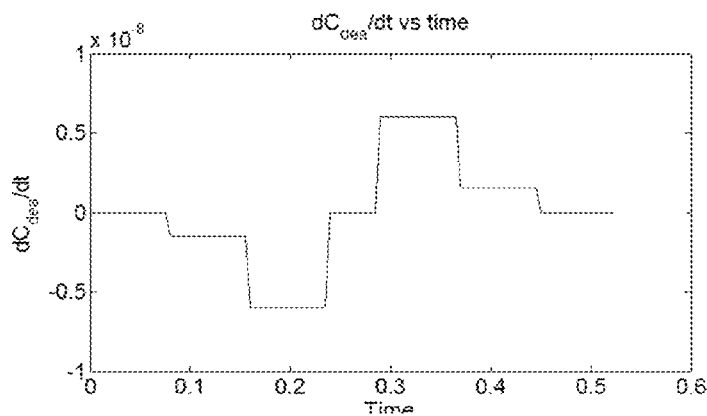
FIG. 10 shows the first derivative of capacitance of the DEA with respect to time versus time over the course of the simulation.
Figure 11:
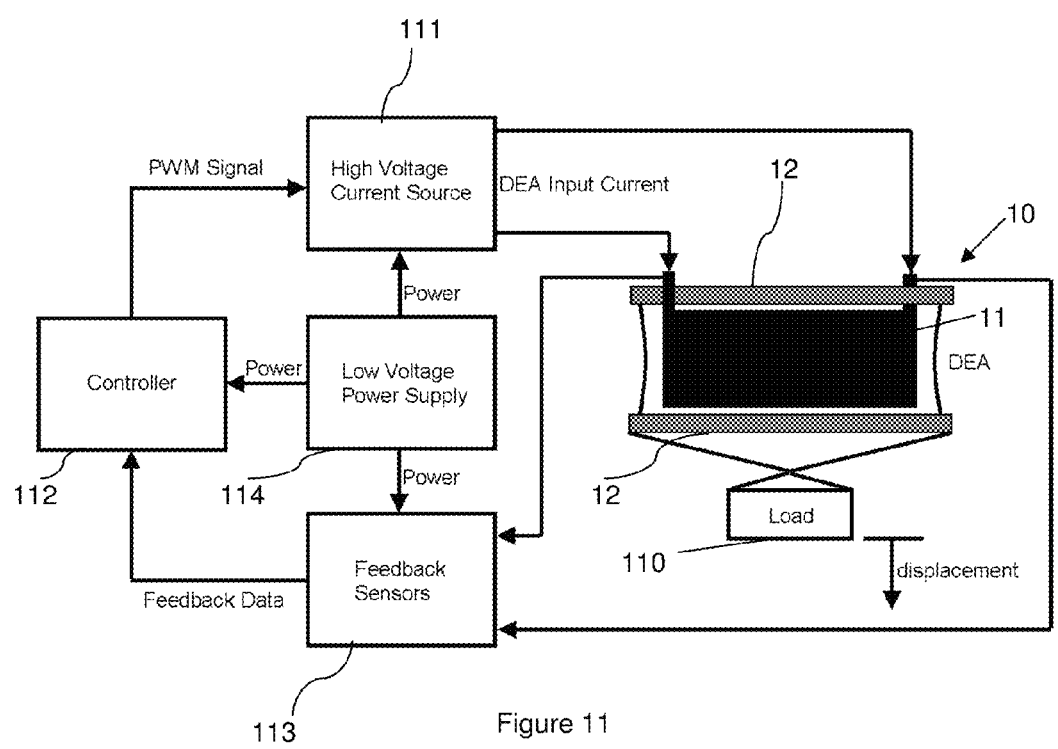
FIG. 11 is a block diagram of an example system using the feedback method of the present invention.

FIG. 7 displays the actual DEA capacitance compared to that predicted by the quasi-static self-sensing method based on Equation 6 in which the effects of $dC_{dea}/dt$ and leakage current are ignored. FIG. 8 compares the actual DEA capacitance with that predicted by the new dynamic self-sensing method described by Equation 9 in which the influence of $dC_{dea}/dt$ and leakage current are approximated using $K_{error}$. FIGS. 10 and 11 show the leakage current and the magnitude of $dC_{dea}/dt$ respectively over the course of the simulation.

As can be seen from FIGS. 7 and 8, the new dynamic self-sensing method offers a significant advantage in the accuracy between predicted and actual DEA capacitance compared to the previously presented quasi-static self-sensing method based on PWM. The accuracy of the quasi-static method is extremely sensitive to the rate of change of the DEA's capacitance. The magnitude of the error can clearly be seen in to be large where the absolute value of $dC_{dea}/dt$ is significant. For this reason the quasi-static approach to calculating capacitance is unsuitable for situations where high speed actuation, whether it is the result of a change in input signal or an external disturbance, is a possibility.

The quasi-static method also lacks any inherent compensation for the effects of leakage current through the dielectric membrane. In FIG. 8 the impact of leakage current manifests itself in the steady state error observed between the true capacitance and the predicted capacitance on the flat region of the capacitance curve from 0.24 seconds to 0.29 seconds. Leakage current increases exponentially with electric field and becomes significant for electric fields greater than approximately 100 MV/m. Anecdotal evidence suggests that for VHB4905 actuators operating above this electric field threshold typically will reduce the lifetime of the DEA considerably. Instead a maximum operating electric field of approximately 60-80 MV/m produces longer-lasting devices. It must be pointed out, however, that better feedback from the DEA may extend the safe range of operation into the region where leakage current is significant. It is also important to consider that different dielectric membrane materials may have different leakage current characteristics than those observed for VHB4905. It is important therefore to account for this current where possible.

In contrast to the quasi-static method, the dynamic method is considerably more accurate for determining the DEA capacitance over the entire range of input conditions. The dynamic capacitance does lag behind the true capacitance by a small amount; however this lag is independent of the rate of change of capacitance and can easily be compensated for by the control system. In every other respect the predicted capacitance shows very good agreement with the actual capacitance. In particular there is no steady state error between the true capacitance and the dynamic prediction for the period from 0.24 seconds to 0.29 seconds, where leakage current is at its maximum. The dynamic method, in accounting for errors due to $dC_{dea}/dt$ and leakage current, effectively addresses the observed shortfalls of the quasi-static method. Being able to back-calculate for the leakage current is also an important and valuable step as it has been suggested that leakage current can enable detection of the precursors to dielectric breakdown. Detecting and preventing breakdown would not only increase device reliability, but also enable the DEA to be driven closer to its performance limits with greater confidence.

The method of calculating capacitance requires $dV_{dea}/dt$ to be equal to zero in order to calculate the lumped error term $K_{error}$, as described above. At high speeds the $dC_{dea}/dt$ component may be so great that the derivative of the voltage across the DEA does not cross zero at any point during the PWM cycle. In this situation it is not possible to calculate the $K_{error}$ and therefore it is not possible to accurately compensate for this term. However, $dV_{dea}/dt$ may still be used to determine if the DEA is converting mechanical energy into electrical energy. In this situation the control system could switch to a generator mode and use the electrical energy created to recharge its power supply, for example.

The properties, performance and functionality of Dielectric Elastomer Actuators make them ideal candidates for artificial muscles. True artificial muscles however must be capable of acting as both sensor and an actuator at the same time. A numerical model of the electrical behaviour of a DEA has been created that incorporates the "non-ideal" characteristics of leakage current and the effects of a variable capacitance. This model has then been used to compare two methods for calculating the capacitance of a DEA: one simple quasi-static method in which the non-ideal elements are ignored; and another more advanced dynamic method that combines the effects of the non-ideal elements into a lumped parameter. The numerical model clearly shows the error between the actual capacitance and the predicted capacitance for the quasi-static method is highly sensitive to the rate of change of capacitance and only provides accurate measurements when the absolute value of $dC_{dea}/dt$ is small. The more dynamic method however addresses the shortfalls of the quasi-static method and has been shown to be robust to changes in capacitance and variable leakage current. It also enables leakage current to be calculated which may prove a valuable step in detecting dielectric breakdown before it happens and subsequently greatly improves the reliability of DEA devices.

The method described herein above may be implemented in a system for determining the capacitance, leakage current, and/or state/position of a dielectric elastomer (or a lever coupled therewith, for example) including a computation means. Where the method of calculating capacitance is intended to form a closed feedback loop for controlling the DEA, the computation means is preferably further adapted to control the DEA by varying the pulse-width of a current supply. Capacitive self-sensing in a DEA has been found to be robust to externally induced deformations of the DEA. A single power supply may be used to power multiple DEAs.

An example of a system including a feedback loop according to the present invention is shown in FIG. 11. In this example, the system comprises a DEA 10 mechanically coupled with a load 110 for controlled displacement thereof. The DEA is supplied by a pulse-width modulated (PWM) high voltage current source 111. The PWM signal is supplied and controlled by the computation means 112 on the basis of feedback from the feedback sensors 113, which together with the DEA 10 form the DEA monitoring circuit described previously. The feedback sensors 113 comprise means for providing an indication or measurement of the voltage difference between electrodes of the DEA, the first derivative of the voltage difference between the electrodes of the DEA with respect to time, and the total instantaneous current through the DEA. Those means in the preferred embodiment of the invention comprise a resistor ladder, a differentiator circuit, and a series resistor (across which the potential difference can be measured to derive the current therethrough), respectively, although it is to be appreciated that any other suitable measurement or sensing means may alternatively be used without departing from the scope of the invention, and the selection and implementation of such sensing means is within the ambit of skills of any person knowledgeable in the area of electronic circuit design.

The current source 111, computation means 112, and feedback sensors 113 can each be supplied by a low voltage power supply 114.

The computation means 112 is programmed or otherwise adapted to calculate the capacitance of the DEA from other characteristics ($i_{Rs}$, $dV_{dea}/dt$, $dC_{dea}/dt$, $V_{dea}$, and $R_{epr}$) measured by the feedback sensors, and to relate this electrical characteristic to the physical state of the DEA 10. Any mismatch between the desired and calculated actual state may be corrected by adjusting the duty cycle of the PWM control signal to supply more or less charge to the DEA according to the difference, using proportional, integral, or differential control, or any combination thereof, for example. Any suitable control scheme may be used without departing from the scope of the invention.

According to a preferred lightweight portable embodiment, the system is battery powered and the computation means comprises a microcontroller. Other computer system configurations can also be employed to perform the method of this invention, and to the extent that a particular system configuration is capable of performing the method of this invention, it is equivalent to the representative digital computer system described, and within the scope and spirit of this invention. Once they are programmed to perform particular functions pursuant to instructions from program software that implements the method of this invention, such digital computer systems in effect become special-purpose computers particular to the method of this invention. The techniques necessary for this are well-known to those skilled in the art of computer systems.

A microcontroller or other computation means 112 adapted to control a DEA using a method of self-sensing feedback as described herein above may be provided to control each artificial muscle in a mechanical system. The computation means 112 or microcontrollers, according to such an embodiment, may therefore provide distributed control of the muscles in the system. Alternatively, or additionally, each microcontroller in the system may be communicatively coupled with a central control means acting to coordinate movement of the muscles in the system by communicating the movement required of each muscle to the respective microcontroller, and each microcontroller acts to control the respective muscle using the self-sensing dynamic feedback method. In such a system, each microcontroller can actuate the muscle independently based in part on information or knowledge of the muscle, such as breakdown strength of the dielectric material or its frequency dependent properties in addition to the calculated leakage current and/or capacitance. The microcontroller can therefore monitor properties of the respective artificial muscle and automatically shut it down or limit the charge if the electric field is getting too high or the leakage current too great, preferably independently of any central control means. Such a circuit would be acting locally, to avoid damage without involving a higher system control, as in an autonomous nervous system. Thus the muscle output can be optimized, reliability improved, and damage to the muscle can be avoided as the system will know its limits. Alternatively, a single computation means 112 may be used to simultaneously control two or more DEAs or artificial muscles as described herein.

From the foregoing it will be seen that an improved method of determining the capacitance, and therefore state, of a dielectric elastomer actuator is provided, which takes into account the both the speed of actuation and the leakage current. Accordingly, the method provides an accurate estimate of the dynamic capacitance and state of a DEA which is more suitable for providing feedback and therefore more precise control of artificial muscles. In particular, the methods and systems according to the invention provide a substantially accurate instantaneous indication of the continuously varying or dynamic capacitance of a DEA, whether through actuation or external perturbations, which may be used to more accurately determine the state of the DEA and provide more accurate and robust control thereof via closed-loop feedback.

Additionally, the system may be practically implemented in real-life applications, including those requiring portability and/or mobility. In mobile robotics applications, for example, it is important that the benefits of a soft, lightweight muscle-like actuator are not outweighed by the size and/or weight of bulky driving and support circuitry such that it becomes inefficient to use DEA. The present invention provides a relatively compact and simple system for controlling a DEA actuator, providing feedback on the actuator state without the need for external position sensors. For example, for a prosthetic hand using one or more DEA actuators as artificial muscles to be truly capable of replicating the functionality of a human hand requires accurate control and low mass, and it must not be tethered to a fixed installation (e.g. a mains power supply). Feedback is necessary to accurately control the artificial muscles in the prosthetic hand in an environment where a wide range of external loading conditions and/or disturbances are to be expected. Low mass is required to reduce the inertia of the device on the end of the wearer's arm.

In another example application, the system and/or method may be used to implement mechano-sensitivity allowing decentralised control and coordination of a plurality of DEA actuators in an array, wherein the actuators themselves are each adapted to propagate an actuation signal by triggering actuation upon detecting deformation caused by contact from an adjacent actuator or a load. Such systems are disclosed only as non-limiting examples of applications of the present invention, and it is to be appreciated that the system and/or method may be adapted for a wide range of other applications without departing from the scope of the invention.

Unless the context clearly requires otherwise, throughout the description, the words "comprise", "comprising", and the like, are to be construed in an inclusive sense as opposed to an exclusive or exhaustive sense, that is to say, in the sense of "including, but not limited to".

Although this invention has been described by way of example and with reference to possible embodiments thereof, it is to be understood that modifications or improvements may be made thereto without departing from the scope of the invention. Furthermore, where reference has been made to specific components or integers of the invention having known equivalents, then such equivalents are herein incorporated as if individually set forth.

Any discussion of the prior art throughout the specification should in no way be considered as an admission that such prior art is widely known or forms part of common general knowledge in the field.

The invention claimed is:

1. A system for determining the capacitance between opposing electrodes of a dielectric elastomer actuator (DEA), the system comprising:
   a DEA monitoring circuit to obtain feedback information regarding the electrical behaviour of DEA; and
   a computer adapted to calculate the capacitance of the DEA as the difference between the total instantaneous current through the DEA and the product of the voltage difference across the DEA and an error term, said difference being divided by the first derivative of the voltage difference across the actuator with respect to time.

2. The system of claim 1, wherein the DEA monitoring circuit comprises:
   a pulse-width modulated current source;
   a dielectric elastomer actuator (DEA);
   a voltage sensor for measuring the voltage difference across the DEA;
   a derivative sensor for measuring the first derivative of the voltage difference across the DEA with respect to time; and
   a current sensor for measuring the total instantaneous current through the DEA.

3. The system of claim 2, wherein the voltage sensor comprises a resistor ladder, the derivative sensor comprises a differentiator circuit, and/or the current sensor comprises a series resistor.

4. The system of claim 1, wherein the error term is equal to the total instantaneous current through the DEA divided by the voltage difference across the DEA when the first derivative of the voltage difference across the DEA with respect to time is equal to zero.

5. The system of claim 1, wherein the computer is further adapted to determine the state of the DEA corresponding with the calculated capacitance.

6. The system of claim 1, wherein the computer is further adapted to monitor the leakage current of the DEA, and to limit the charge upon the electrodes when the leakage current exceeds a predefined threshold.

7. A method of determining the capacitance between opposing electrodes of a dielectric elastomer actuator (DEA), the method comprising the steps of:
   measuring the voltage difference between the electrodes of the DEA;
   determining the first derivative of the voltage difference between the electrodes of the DEA with respect to time;
   measuring the total instantaneous current through the DEA; and
   calculating the capacitance of the DEA as the difference between the total instantaneous current through the DEA and the product of the voltage between the electrodes of the DEA and an error term, said difference being divided by the first derivative of the voltage between the electrodes of the actuator with respect to time.

8. The method of claim 7, wherein the error term is equal to the total instantaneous current through the DEA divided by the voltage difference between the electrodes of the DEA when the first derivative of the voltage difference between the electrodes of the DEA with respect to time is equal to zero.

9. The method of claim 7, wherein the DEA is supplied by a pulse-width modulated (PWM) current source having a limited slew rate on either or both edges.

10. The method of claim 9, wherein the slew rate of the current source is selected to enable accurate detection of the zero-crossing of the first derivative of the voltage difference between the electrodes of the DEA with respect to time, thereby minimising sensitivity to errors in the sample timing when sampling the total instantaneous current through the DEA.

11. The method of claim 7, wherein the step of measuring the voltage difference between the electrodes of the DEA comprises approximating the voltage using a resistor ladder.

12. The method of claim 7, wherein the step of determining the first derivative of the voltage difference between the electrodes of the DEA with respect to time comprises approximating the first derivative using a differentiator circuit.

13. The method of claim 7, wherein the step of determining the first derivative of the voltage difference between the electrodes of the DEA with respect to time comprises approximating the first derivative using a finite difference method on sequential measurements of the voltage difference between the electrodes of the DEA.

14. The method of claim 7, wherein the step of measuring the total instantaneous current through the DEA comprises the step of measuring the voltage difference across a known series resistance.

15. A method of determining the leakage current between opposing electrodes of a dielectric elastomer actuator (DEA), the method comprising the steps of:
  determining the capacitance between the electrodes according to the method of claim 7;
  calculating the first derivative of the capacitance with respect to time; and
  calculating the leakage current as the difference between the total instantaneous current through the DEA and the product of the voltage difference across the DEA and the first derivative of the capacitance with respect to time, at a point in time when the first derivative of the voltage difference across the DEA with respect to time is substantially equal to zero.

16. A method of determining the state of a dielectric elastomer actuator (DEA), the method comprising the steps of:
  determining the capacitance between opposing electrodes of the actuator according to the method of claim 7; and
  determining the state of the DEA corresponding with the capacitance.

17. The method of claim 16, wherein the step of determining the state of the DEA comprises the steps of:
  determining a capacitance ratio of the instantaneous capacitance of the DEA to its initial capacitance;
  relating the capacitance ratio to the area ratio between the instantaneous planar area of the DEA to its initial planar area; and
  determining the displacement of the DEA from the relationship between the capacitance and area ratios.

18. A method of controlling a dielectric elastomer actuator (DEA) comprising the steps of:
  determining the state of the DEA according to the method of claim 16; and
  controlling the charge on the electrodes of the DEA according to the difference between the determined state and a desired state of the DEA.

19. The method of claim 18 further comprising the steps of:
  determining a leakage current between opposing electrodes of the DEA by
    obtaining the capacitance between the opposing electrodes of the DEA;
    calculating, with respect to time, the first derivative of the capacitance between the opposing electrodes of the DEA;
    calculating the leakage current as the difference between the total instantaneous current through the DEA and the product of the voltage difference across the DEA and the first derivative of the capacitance with respect to time, at a point in time when the first derivative of the voltage difference across the DEA with respect to time is substantially equal to zero; and
  limiting the charge upon the electrodes when the leakage current exceeds a predefined threshold.

20. A method of determining the state of a dielectric elastomer actuator (DEA), the method comprising the steps of:
  a) determining the ratio between the total instantaneous current through the DEA and the voltage difference across the DEA at a time when the change in voltage difference across the DEA is zero or close to zero;
  b) multiplying the ratio of step a) with the voltage difference across the DEA when the change in voltage is non-zero;
  c) subtracting the product of step b) from the total instantaneous current through the DEA;
  d) dividing the sum of step c) by the instantaneous change in voltage difference across the DEA with respect to time; and
  e) using the product of step d) to determine the state of the DEA.

* * * * *